United States Patent
Upputuri et al.

(10) Patent No.: US 12,025,661 B1
(45) Date of Patent: Jul. 2, 2024

(54) POWER-SENSITIVE SCAN-CHAIN TESTING

(71) Applicant: Marvell Asia Pte Ltd, Singapore (SG)

(72) Inventors: Balaji Upputuri, Andhra Pradesh (IN); Sreekanth G. Pai, Cochin (IN); Kushal Kamal, Bangalore (IN)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 18/159,344

(22) Filed: Jan. 25, 2023

Related U.S. Application Data

(60) Provisional application No. 63/338,447, filed on May 4, 2022.

(51) Int. Cl.
*G01R 31/3185* (2006.01)

(52) U.S. Cl.
CPC ........ *G01R 31/318536* (2013.01); *G01R 31/318547* (2013.01); *G01R 31/318552* (2013.01); *G01R 31/318555* (2013.01); *G01R 31/318572* (2013.01); *G01R 31/318575* (2013.01)

(58) Field of Classification Search
CPC .... G01R 31/318536; G01R 31/318547; G01R 31/318552; G01R 31/318555; G01R 31/318572; G01R 31/318575
USPC .......................... 714/726, 729, 731
See application file for complete search history.

(56) References Cited

U.S. PATENT DOCUMENTS

| | | | | |
|---|---|---|---|---|
| 7,693,676 | B1* | 4/2010 | Keller ............ | G01R 31/318575 714/739 |
| 2006/0095802 | A1* | 5/2006 | Dhong ................. | G06F 1/325 713/320 |
| 2006/0242515 | A1* | 10/2006 | Alvamani ...... | G01R 31/318547 714/729 |
| 2012/0043991 | A1* | 2/2012 | Lin ................ | G01R 31/318575 326/16 |
| 2014/0181603 | A1* | 6/2014 | Grau .............. | G01R 31/318594 714/726 |
| 2015/0285859 | A1* | 10/2015 | Jajodia ............. | G01R 31/31724 714/729 |
| 2023/0299754 | A1* | 9/2023 | Zlotnik .................. | H03K 3/012 327/199 |

OTHER PUBLICATIONS

Sinanoglu et al., Test Power Reduction Through Minimization of Scan Chain Transitions, 2002, IEEE, pp. 1-6. (Year: 2002).*
Elshoukry et al., Partial Gating Optimization for Power Reduction During Test Application, 2005, IEEE, pp. 1-4. (Year: 2005).*

* cited by examiner

*Primary Examiner* — John J Tabone, Jr.

(57) ABSTRACT

A method of scan-chain testing of an integrated circuit device having a plurality of respective scan-chain paths, at least some of the respective scan-chain paths being designated as having resource constraints, includes propagating a respective scan-chain data pattern through each of the respective scan-chain paths, and gating each respective scan-chain path designated as having resource constraints, to reduce a rate of scan-chain data propagation through the respective scan-chain path, without gating any scan-chain path not designated as having resource constraints. Scan-chain paths may be designated as having resource constraints because of high power consumption or data congestion.

24 Claims, 3 Drawing Sheets

POWER-SENSITIVE SCAN-CHAIN TESTING

CROSS REFERENCE TO RELATED APPLICATION

This disclosure claims the benefit of commonly-assigned U.S. Provisional Patent Application No. 63/338,447, filed May 4, 2022, which is hereby incorporated by reference herein in its entirety.

FIELD OF USE

This disclosure relates to scan-chain testing of an integrated circuit design. More particularly, this disclosure relates to scan-chain testing that selectively restricts the propagation of scan chains through test channels of an integrated circuit device based on resource constraints in each scan channel.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit devices may be tested by scan-chain testing, in which predetermined patterns of 0s and 1s are clocked through the registers of specific logic paths in the integrated circuit device. The output of each scan-chain path would be expected to have a particular output pattern, based on the logic between registers, if the device is functioning correctly. If the output pattern is not the pattern that is expected, it may indicate an error in the logic design, or a process fault during fabrication. However, depending on the particular logic design of each scan-chain path, different paths may experience resource constraints, such as higher power consumption and/or data congestion. In order to reduce power consumption during testing, if parts of a device experience resource constraints, a switching factor may be applied to gate or throttle the propagation of the scan-chains. However, while such gating may reduce power consumption and therefore reduce one cost factor of the testing, the gating may reduce scan pattern efficiency, increasing the number of scan chain patterns required to test the device, and therefore increasing a different cost factor of the testing. Moreover, scan-chain paths that are not resource-constrained may be unnecessarily gated.

SUMMARY

In accordance with implementations of the subject matter of this disclosure, a method of scan-chain testing of an integrated circuit device having a plurality of respective scan-chain paths, at least some of the respective scan-chain paths being designated as having resource constraints, includes propagating a respective scan-chain data pattern through each of the respective scan-chain paths, and gating each respective scan-chain path designated as having resource constraints, to reduce a rate of scan-chain data propagation through the respective scan-chain path, without gating any scan-chain path not designated as having resource constraints.

In a first implementation of such a method, gating each respective scan-chain path designated as having resource constraints may include gating each respective scan-chain path designated as having high power consumption or data congestion.

According to a first aspect of that first implementation, gating each respective scan-chain path designated as having high power consumption or data congestion may include individually gating each respective scan-chain path, designated as having high power consumption or data congestion, to reduce the rate of scan-chain data propagation through the respective scan-chain path by an individual desired amount.

According to a second aspect of that first implementation, gating each respective scan-chain path designated as having high power consumption or data congestion may include grouping respective pluralities of the scan-chain paths, designated as having high power consumption or data congestion, according to degree of power consumption or data congestion, and gating all scan-chain paths in each respective plurality of scan-chain paths to reduce the rate of scan-chain data propagation through all scan-chain paths in the respective plurality of scan-chain paths by a common desired amount.

According to a third aspect of that first implementation, gating each respective scan-chain path designated as having high power consumption or data congestion may include routing each respective scan-chain path to a first input of a respective logic gate, and routing a respective test-mode control signal to a second input of the respective logic gate.

In a first instance of that third aspect, routing each respective scan-chain path to the first input of the respective logic gate may include routing each respective scan-chain path to a first input of a respective AND-gate, and routing the respective test-mode control signal to the second input of the respective logic gate may include routing the respective test-mode control signal to the second input of the respective AND-gate, each respective AND-gate passing scan-chain data on the respective scan-chain path when the respective test-mode control signal is high.

In a second instance of that third aspect, routing the respective test-mode control signal to the second input of the respective logic gate may include routing a respective divided clock signal to the second input of the respective logic gate.

In a first alternative of that second instance, when the integrated circuit device has a plurality of respective scan-chain testing modes, routing the respective divided clock signal to the second input of the respective logic gate may include dividing the clock signal by a switching factor n using a programmable modulo-n counter, and programming the switching factor n of the modulo-n counter according to a respective scan-chain testing mode to be performed.

In a third instance of that third aspect, routing the respective test-mode control signal to the second input of the respective logic gate may include routing the respective test-mode control signal from a low-power testing controller.

In a fourth instance of that third aspect, routing the respective test-mode control signal to the second input of the respective logic gate may include grouping respective pluralities of the scan-chain paths, designated as having high power consumption or data congestion, according to degree of power consumption or data congestion, and routing, to all scan-chain paths in each respective plurality of scan-chain paths, a respective common test-mode control signal to reduce the rate of scan-chain data propagation through all scan-chain paths in the respective plurality of scan-chain paths by a common desired amount.

A first alternative of that fourth instance may further include, after propagating the respective scan-chain data patterns through each of the respective scan-chain paths, compressing the propagated scan-chain data patterns.

A fourth aspect of that first implementation may further include receiving compressed scan-chain data, and decompressing the received compressed scan-chain data to extract each respective scan-chain data pattern.

In accordance with implementations of the subject matter of this disclosure, an integrated circuit device has a plurality of input/output terminals, and scan-chain testing circuitry including a plurality of respective scan-chain paths configured to receive scan-chain data patterns from first ones of the plurality of input/output terminals, and to propagate the respective scan-chain data patterns to second ones of the plurality of input/output terminals, at least some of the respective scan-chain paths being designated as having resource constraints, and scan-chain path gating circuitry configured to gate each respective scan-chain path that is designated as having resource constraints, to reduce a rate of scan-chain data propagation through the respective scan-chain path, without gating any scan-chain path not designated as having resource constraints.

In a first implementation of such an integrated circuit device, the respective scan-chain paths designated as having resource constraints may be designated as having high power consumption or data congestion, and the scan-chain path gating circuitry may be configured to gate each respective scan-chain path that is designated as having high power consumption or data congestion.

According to a first aspect of that first implementation, the scan-chain path gating circuitry may be configured to individually gate each respective scan-chain path, designated as having high power consumption or data congestion, to reduce the rate of scan-chain data propagation through the respective scan-chain path by an individual desired amount.

According to a second aspect of that first implementation, the scan-chain path gating circuitry may be configured to group respective pluralities of the scan-chain paths, designated as having high power consumption or data congestion, according to degree of power consumption or data congestion, and gate all scan-chain paths in each respective plurality of scan-chain paths to reduce the rate of scan-chain data propagation through all scan-chain paths in the respective plurality of scan-chain paths by a common desired amount.

According to a third aspect of that first implementation, the scan-chain path gating circuitry may include a respective logic gate in each respective scan-chain path, the scan-chain path gating circuitry being configured to route each respective scan-chain path to a first input of a respective logic gate, and route a respective test-mode control signal to a second input of the respective logic gate.

In a first instance of that third aspect, the respective logic gate may be a respective AND-gate, and the scan-chain path gating circuitry may be configured to route each respective scan-chain path to a first input of the respective AND-gate, and route the respective test-mode control signal to the second input of the respective AND-gate, so that each respective AND-gate may pass scan-chain data on the respective scan-chain path when the respective test-mode control signal is high.

In a second instance of that third aspect, the scan-chain path gating circuitry may be configured to generate a respective divided clock signal as the respective test-mode control signal, and route the respective divided clock signal to the second input of the respective logic gate.

In a first alternative of that third aspect, when the integrated circuit device has a plurality of respective scan-chain testing modes, the scan-chain path gating circuitry may include a modulo-n counter configured to divide the clock signal by a switching factor n to generate each respective divided clock signal, and the switching factor n of the modulo-n counter may be programmable according to a respective scan-chain testing mode to be performed.

In a third instance of that third aspect, the scan-chain path gating circuitry may include a low-power testing controller configured to generate the respective test-mode control signal.

In a fourth instance of that third aspect, the scan-chain path gating circuitry may be configured to group respective pluralities of the scan-chain paths, designated as having high power consumption or data congestion, according to degree of power consumption or data congestion, and route, to all scan-chain paths in each respective plurality of scan-chain paths, a respective common test-mode control signal to reduce the rate of scan-chain data propagation through all scan-chain paths in the respective plurality of scan-chain paths by a common desired amount.

A first alternative of that fourth instance may further include compressor circuitry configured to compress the respective scan-chain data patterns after propagation through each of the respective scan-chain paths, and output the compressed propagated scan-chain data patterns to second ones of the input/output terminals.

A fourth aspect of that first implementation may further include decompressor circuitry configured to receive compressed scan-chain data from first ones of the input/output terminals, and decompress the received compressed scan-chain data to extract each respective scan-chain data pattern.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
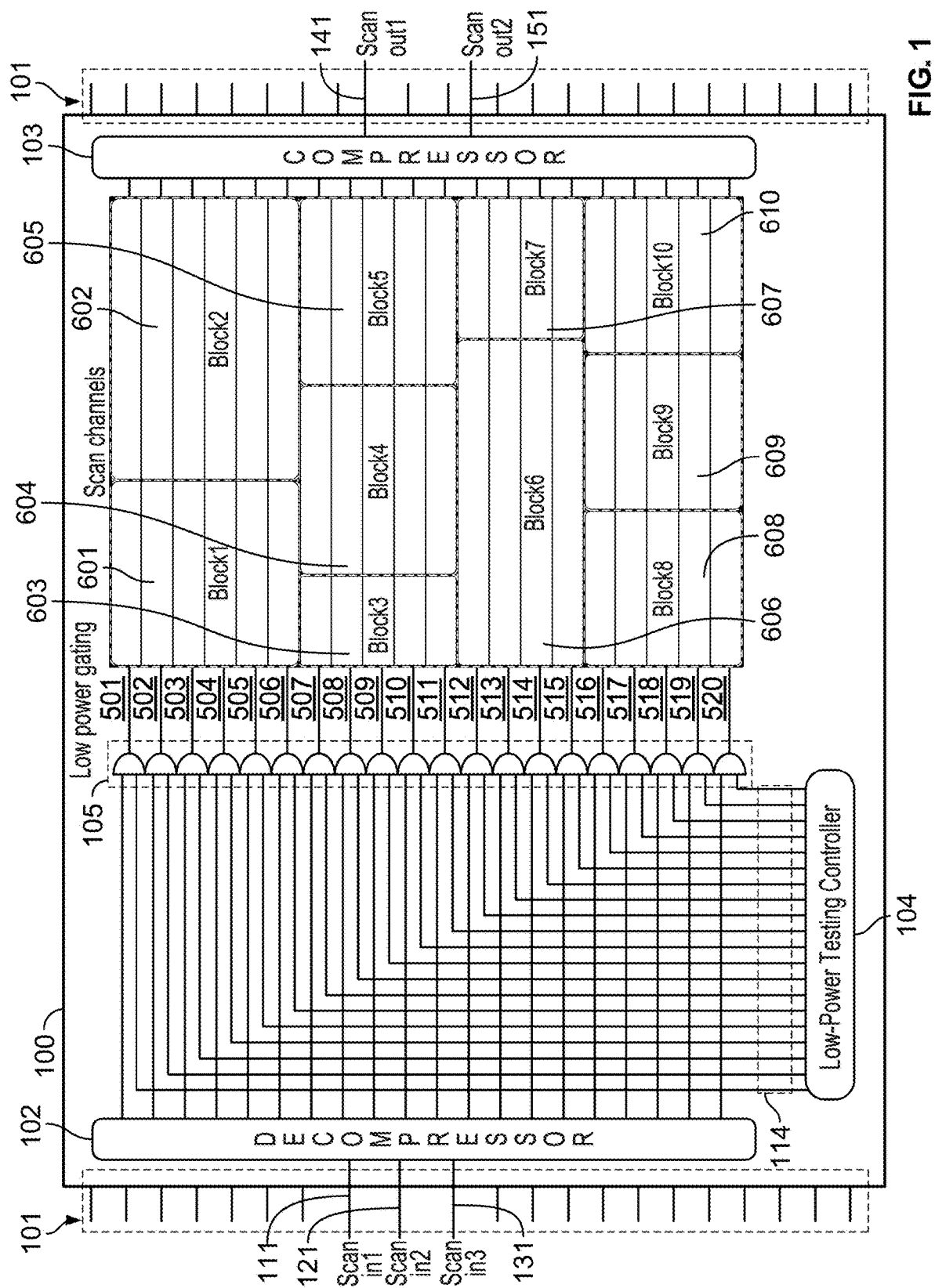
FIG. 1 is a simplified representation of an integrated circuit device that may be tested according to implementations of the subject matter of this disclosure.

As noted above, integrated circuit devices may be tested by scan-chain testing, in which predetermined patterns of 0s and 1s are clocked through the registers of specific logic paths in the integrated circuit device. The output of each scan-chain path would be expected to have a particular output pattern, based on the logic between registers, if the device is functioning correctly. If the output pattern is not the pattern that is expected, it may indicate an error in the logic design, or a process fault during fabrication. However, depending on the particular logic design of each scan-chain path, different paths may experience resource constraints such as higher power consumption and/or data congestion. In order to reduce power consumption during testing, if parts of a device experience resource constraints, a switching factor may be applied to gate or throttle the propagation of all of the scan-chains. However, while such gating may reduce power consumption and therefore reduce one cost factor of the testing, the gating may reduce scan pattern efficiency, increasing the number of scan chain patterns required to test the device, and therefore increasing a different cost factor of the testing. Moreover, scan-chain paths that are not resource-constrained may be unnecessarily gated.

Therefore, in accordance with implementations of the subject matter of this disclosure, rather than gating all scan-chain paths in situations where some of the scan-chain paths exhibit resource constraints such as congestion or high power consumption, only scan-chain paths that exhibit such resource constraints are gated. Moreover, among the scan-chain paths that are gated, different scan-chain paths may be gated by different switching factors, according to the level of resource constraint in each scan-chain path.

In some implementations of the subject matter of this disclosure, the gating of the scan-chain paths may be performed by a low-power testing controller. In some implementations, the low-power testing controller may selectively apply a determined switching factor to each scan-chain path that experiences resource constraints. In other implementations, the low-power testing controller may apply determined switching factors to groups of scan-chain paths. In either case, the determined switching factor may be derived from characteristics of the design of the integrated circuit device being tested, which allow prediction of the power consumption patterns. Because the determined switching factor is derived predictively from characteristics of the circuit design, some scan-chain paths may be unnecessarily gated if they are not in fact experiencing resource constraints, but on average the gating of the scan-chain paths will nevertheless reduce testing power consumption and/or improve test pattern efficiency. Alternatively, the required switching factor for any one channel may be derived by real-time monitoring of resources, such as congestion levels or power consumption, on each channel, but such an implementation would require additional circuitry for resource monitoring.

In some implementations, an AND-gate is inserted into each scan-chain path of the integrated circuit device, and those AND-gates provide the mechanism by which the low-power testing controller applies the switching factor to each scan-chain path to be gated. A gating signal output by the low-power testing controller is applied to one input of the AND-gate while the scan-chain pattern to be propagated in the particular scan-chain path is applied to the other input of the AND-gate. For a scan-chain path that is not gated, the low-power testing controller will apply a continuous high, or '1', signal to the control input of the AND-gate, allowing the scan-chain pattern applied to the other input to propagate freely at the default clock rate of the integrated circuit device.

For a scan-chain path that is to be gated, the low-power testing controller will apply to the control input of the AND-gate a signal that is high only some of the time, based on the switching factor for that scan-chain path. For example, for a switching factor of 10%, the AND-gate control input will be high only 10% of the time; for a switching factor of 25%, the AND-gate control input will be high only 25% of the time. In order to achieve the desired control signal, the low-power testing controller may apply a time-based duty-cycle to the control signal, turning the control signal on for the desired percentage of time. Alternatively, the low-power testing controller may include a clock divider that divides the clock rate of the scan-chain path being gated to achieve a desired switching factor. The clock divider may be implemented by a counter that is set to a number n (i.e., a programmable modulo-n counter), so that the counter increments only after n pulses of the scan-chain clock to allow one bit of the scan chain to propagate.

n is set based on the relationship of the desired switching factor to the default switching factor of the input signal. For example, if the default switching factor is acceptable for the channel in question, then n would be set to '0', allowing the scan-chain clock to be passed after 0 counts of the counters—i.e., to run unimpeded—and therefore passing the scan-chain pattern without gating. If a switching factor lower than the default switching factor is needed, then a non-zero value of n may be set, which would have the effect of dividing the scan-chain clock, and therefore the switching factor. Thus, if n=1, each scan-chain clock pulse would have to wait one additional system clock cycle for the counter to count up, meaning one scan-chain clock pulse would pass every other clock cycle—i.e., dividing the scan-chain clock rate by 2. If n=2, each scan-chain clock pulse would have to wait two additional system clock cycles for the counter to count up, meaning one scan-chain clock pulse would pass every third clock cycle—i.e., dividing the scan-chain clock rate by 3. More generally, for any counter value n, the scan-chain clock rate, and therefore the switching factor, would be divided by n+1.

Each complete scan chain would still be propagated. However, for any scan chain for which the counter value is n>0, it would take n+1 times as many clock cycles for propagation to occur. Thus, for high-power or congested scan channels, the scan-chain testing time would increase, but power and congestion would not be increased, or would be increased less.

There may be more than one scan-chain testing mode in a given device to be tested. For example, there may be Automatic Test Pattern Generation (ATPG) testing, Transition testing, built-in memory self-testing (Memory-BIST), and quiescent power-supply current (IDDq) testing. In addition, certain types of safety-critical devices have a logic built-in self-test (LBIST) mode that can test internal circuits having no direct connections to external pins. In a device that is performing more than one of these different types of scan-chain testing, each different type of scan-chain testing may require a different switching factor. In such implementations, the switching factor may be adjustable—e.g., by changing the value n that the counter must reach to propagate a scan-chain bit—so that it can be reset each time a new scan-chain testing mode is activated, or even during testing (i.e., "on the fly") if needed.

On any integrated circuit device to be tested, each scan chain may have an input coupled directly to a respective input pad or pin, and an output coupled directly to a respective output pad or pin. However, in many cases, there may not be enough pads or pins available to couple each scan chain directly to an input pin and an output pin. In such cases, the input scan chains may be multiplexed, or "compressed" onto a smaller number of inputs, with each compressed scan-chain input pad or pin being coupled to a decompressor which demultiplexes the scan chains for propagation onto their respective scan-chain paths for testing, and a compressor that (re)multiplexes the output scan chains into the original (or a different) number of compressed outputs. In such implementations, the low-power testing controller, and the aforementioned AND-gates, may be part of the compressor-decompressor (i.e., "codec") structure.

Figure 2:
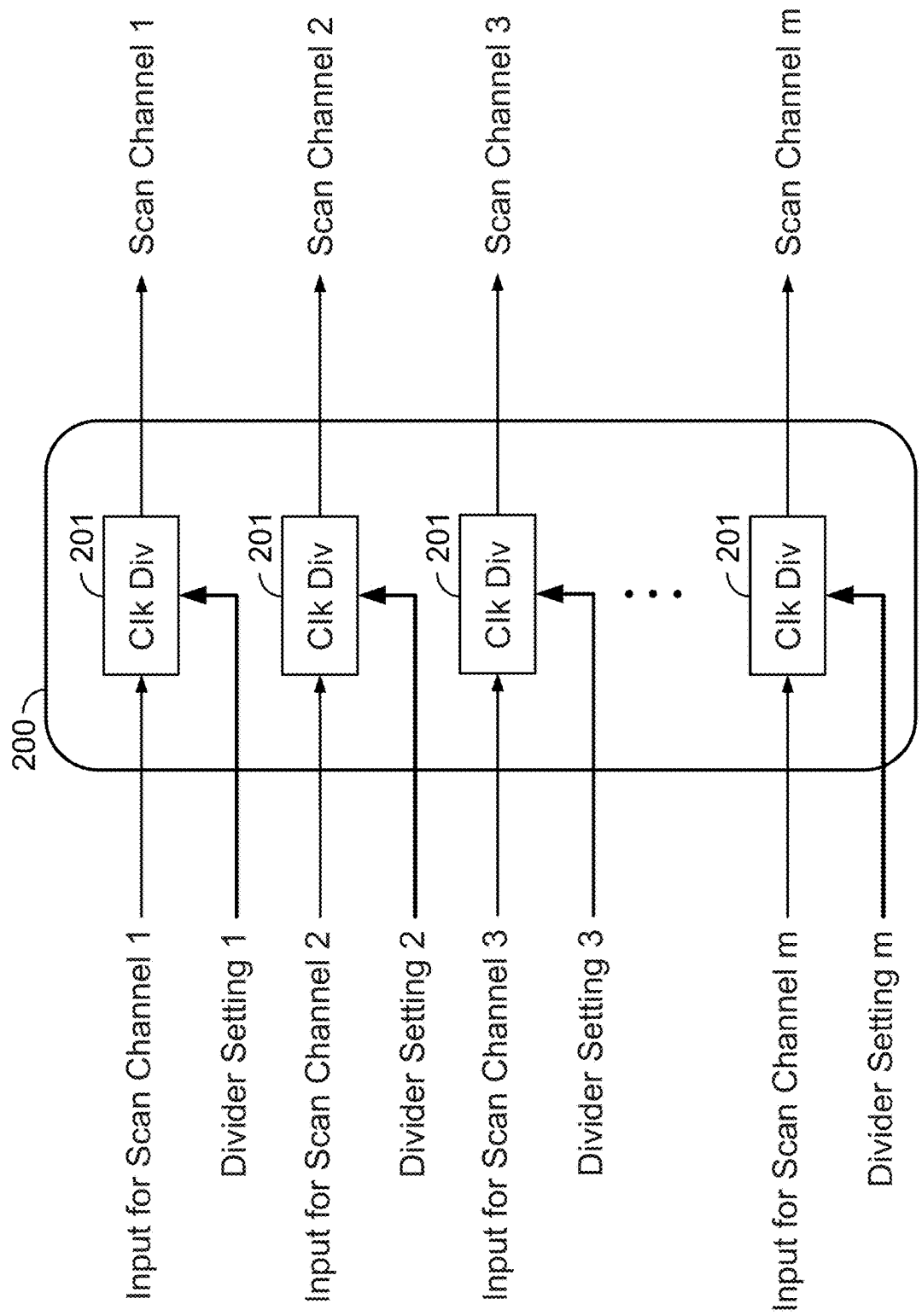
FIG. 2 is a simplified representation of a low-power testing controller that may be incorporated in implementations of an integrated circuit device in accordance with the subject matter of this disclosure.
Figure 3:
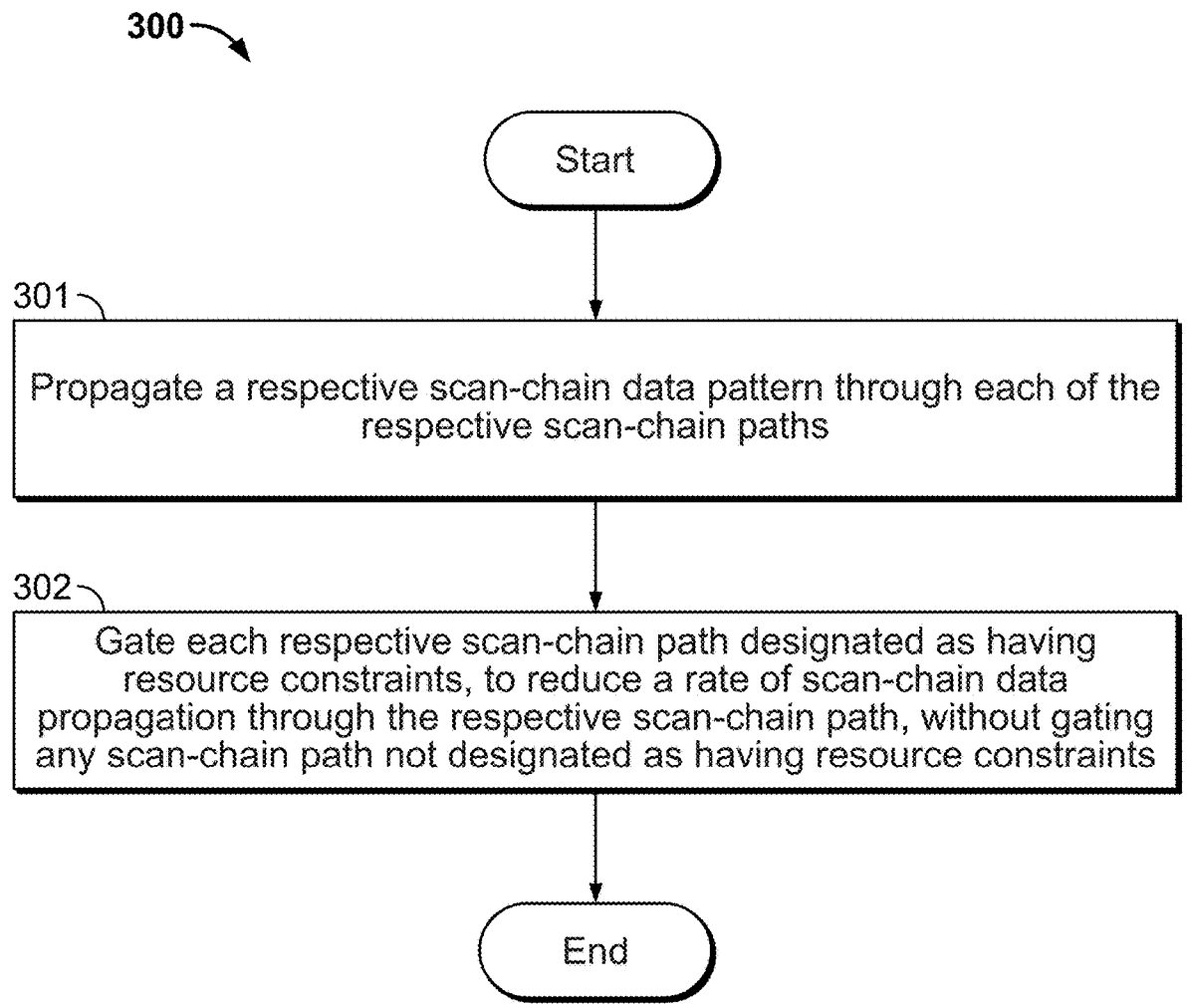
FIG. 3 is a flow diagram illustrating implementations of a method in accordance with the subject matter of this disclosure.

The subject matter of this disclosure may be better understood by reference to FIGS. 1-3.

FIG. 1 shows an integrated circuit device 100 in accordance with implementations of the subject matter of this disclosure. Integrated circuit device 100 includes various blocks of functional circuitry (not shown) coupled to input/output terminals (e.g., pins) 101. Various scan chains are provided throughout integrated circuit device 100, passing through the areas containing unseen functional circuits, for the purpose of testing whether logic in various portions of integrated circuit device 100 functions as intended—both from a logic design perspective, as well as from a more fundamental quality control perspective (i.e., to determine whether process failures during fabrication resulted in gates that do not function properly). Twenty scan-chain paths or channels 501-520 are shown, but the number may be much larger; for example, there may be hundreds of scan-chain paths, or more.

In the implementation shown in FIG. 1, scan-chains are input to scan-chain paths 501-520 in compressed or multiplexed format via three input terminals 111, 121, 131 of terminals 101. The compressed scan chains are decompressed in decompressor 102 for propagation onto scan-chain paths 501-520. In this implementation, after the scan chains propagate through scan-chain paths 501-520, the propagated scan chains are again compressed, in compressor 103, for output via input/output terminals 141, 151 of terminals 101. However, decompressor 102 and compressor 103 are optional, and in other implementations, if there are enough available input/output pins 101 (for example, there may be an implementation in which input/output pins 101 may be convertible from a first set of uses during a functional mode to a second set of uses during a test mode), decompressor 102 and compressor 103 may be omitted or may remain unused.

In any event, regardless of whether or not the scan chain data is input and output in compressed form, each scan-chain path 501-520 may pass through different areas or blocks of logic. For illustration purposes, ten blocks 601-610 of logic are shown, but there may be any number of blocks of logic. Each block 601-610 of logic may have a different set of resource constraints that affect power consumption as the scan chains propagate. For example, some of blocks 601-610 of logic may have no resource constraints, while others of blocks 601-610 of logic may have varying degrees of power sensitivity and/or may be subject to varying degrees of congestion. There may be other forms of resource constraints that affect power consumption as the scan chains propagate.

Therefore, in accordance with implementations of the subject matter of this disclosure, a low-power testing controller 104 may be provided to selectively slow down the propagation of scan chains, in conjunction with logic gates 105. As discussed above, in some implementations, low-power testing controller 104 may selectively apply a determined switching factor to each one of scan-chain paths 501-520 that experiences resource constraints, to slow down the propagation of scan chains on each respective path by an individual desired amount. In other implementations, low-power testing controller 104 may apply determined switching factors to groups of scan-chain paths, to slow down the propagation of scan chains on all respective paths in each group by a desired amount for that group. For example, if one of the aforementioned blocks 601-610 of logic experiences resource constraints, then low-power testing controller 104 can apply a switching factor to each one of scan channels 501-520 that passes through the block that is experiencing resource constraints. For example, if block 605 of logic is experiencing resource constraints, then scan channels 512-515 may have a switching factor applied to slow propagation of scan data on those channels. In that illustration, scan channels 512-515 also pass through blocks 603 and 604 of logic, which are not experiencing resource constraints. However, because the switching factor is applied on a scan-channel basis, the propagation of scan data through blocks 603 and 604 of logic also will be slowed.

The determined switching factor may be derived from characteristics of the design of the integrated circuit device being tested, which allow prediction of resource utilization such as power consumption patterns. Because the determined switching factor is derived predictively from characteristics of the circuit design, in some cases one of scan-chain paths 501-520 may be unnecessarily gated if it is not in fact experiencing resource constraints as predicted, but on average the gating of the scan-chain paths 501-520 will nevertheless reduce testing power consumption and/or improve test pattern efficiency. Alternatively, the required switching factor for any one channel may be derived by real-time monitoring of resources, such as congestion levels or power consumption, on each channel, but such an implementation would require additional circuitry (not shown) for resource monitoring.

As noted above, low-power testing controller 104 may work in combination with logic gates 105 to apply a switching factor to individual ones or groups of scan channels 501-520. In some implementations, each of logic gates 105 is a respective AND-gate inserted into each respective one of scan-chain paths 501-502, and those AND-gates 105 provide the mechanism by which low-power testing controller 104 applies the switching factor to each of scan-chain paths 501-520 to be gated. A plurality of respective gating signals 114 are output by low-power testing controller 104. Each respective gating signal 114 is applied to one input of a respective AND-gate 105 while the scan-chain pattern to be propagated in the particular one of scan-chain paths 501-520 is applied to the other input of that respective AND-gate 105. For one of scan-chain paths 501-520 that does not require gating, low-power testing controller 104 will apply a continuous high, or '1', signal 114 to the control input of respective AND-gate 105, allowing the scan-chain pattern applied to the other input of the respective AND-gate 105 to propagate freely at the default clock rate of the integrated circuit device.

For a respective one of scan-chain paths 501-520 that is to be gated, low-power testing controller 104 will apply to the control input of the respective AND-gate 105 a signal that is high only some of the time, based on the switching factor that has been determined for that scan-chain path. For example, for a switching factor of 10%, the AND-gate control input will be high only 10% of the time; for a switching factor of 25%, the AND-gate control input will be high only 25% of the time. In order to achieve the desired control signal, low-power testing controller 104 may apply a time-based duty-cycle to the control signal, turning the control signal on for the desired percentage of time.

Alternatively, low-power testing controller 104 may have the structure shown in FIG. 2, including a respective clock divider 201 that divides the clock rate of each respective one of m scan-chain paths to achieve a desired switching factor. In the illustration in FIG. 1, m=20 for scan channels 501-520, but in an actual implementation, m would be equal to the actual number of scan channels, which is likely to be much greater than 20. Each clock divider 201 may be implemented by a counter that is set to a number n, so that the counter increments only after n pulses of the scan-chain clock to allow one bit of the scan chain to propagate.

n is set based on the relationship of the desired switching factor to the default switching factor of the input signal. For example, if the default switching factor is acceptable for the channel in question, then n would be set to '0', allowing the scan-chain clock to be passed after 0 counts of the counters—i.e., to run unimpeded—and therefore passing the scan-chain pattern without gating. If a switching factor lower than the default switching factor is needed, then a non-zero value of n may be set, which would have the effect of dividing the scan-chain clock, and therefore the switching factor. Thus, if n=1, each scan-chain clock pulse would have to wait one additional system clock cycle for the counter to count up, meaning one scan-chain clock pulse would be propagated every other clock cycle—i.e., dividing the scan-chain clock rate by 2. If n=2, each scan-chain clock pulse would have to wait two additional system clock cycles for the counter to count up, meaning one scan-chain clock pulse would be propagated every third clock cycle—i.e., dividing the scan-chain clock rate by 3. More generally, for any counter value n, the scan-chain clock rate would be divided by a switching factor n+1.

Each complete scan chain would still be propagated. However, for any scan chain for which the counter value is n>0, it would take n+1 times as many clock cycles for propagation to occur. Thus, for high-power or congested scan channels, the scan-chain testing time would increase, but power and congestion would not be increased, or, if increased, would be increased less.

FIG. 3 is a flow diagram illustrating a method 300 in accordance with implementations of the subject matter of this disclosure for scan-chain testing an integrated circuit device having a plurality of respective scan-chain paths, at least some of the respective scan-chain paths being designated as having resource constraints. Method 300 begins at 301 where a respective scan-chain data pattern is propagated through each of the respective scan-chain paths. At 302, each respective scan-chain path that is designated as having resource constraints is gated, to reduce a rate of scan-chain data propagation through the respective scan-chain path, without gating any scan-chain path not designated as having resource constraints. Method 300 then ends.

Thus it is seen that a method and apparatus for scan-chain testing that selectively restricts the propagation of scan chains through test channels of an integrated circuit device based on resource constraints in each scan channel has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of scan-chain testing of an integrated circuit device having a plurality of respective scan-chain paths, at least some of the respective scan-chain paths being designated as having resource constraints, the method comprising:

propagating a respective scan-chain data pattern through each of the respective scan-chain paths; and gating each respective scan-chain path designated as having resource constraints, to reduce a rate of scan-chain data propagation through the respective scan-chain path, without gating any scan-chain path not designated as having resource constraints.

2. The method of claim 1 wherein gating each respective scan-chain path designated as having resource constraints comprises gating each respective scan-chain path designated as having high power consumption or data congestion.

3. The method of scan-chain testing according to claim 2 wherein gating each respective scan-chain path designated as having high power consumption or data congestion comprises individually gating each respective scan-chain path, designated as having high power consumption or data congestion, to reduce the rate of scan-chain data propagation through the respective scan-chain path by an individual desired amount.

4. The method of scan-chain testing according to claim 2 wherein gating each respective scan-chain path designated as having high power consumption or data congestion comprises:

grouping respective pluralities of the scan-chain paths, designated as having high power consumption or data congestion, according to degree of power consumption or data congestion; and gating all scan-chain paths in each respective plurality of scan-chain paths to reduce the rate of scan-chain data propagation through all scan-chain paths in the respective plurality of scan-chain paths by a common desired amount.

5. The method of scan-chain testing according to claim 2 wherein gating each respective scan-chain path designated as having high power consumption or data congestion comprises:

routing each respective scan-chain path to a first input of a respective logic gate; and routing a respective test-mode control signal to a second input of the respective logic gate.

6. The method of scan-chain testing according to claim 5 wherein:

routing each respective scan-chain path to the first input of the respective logic gate comprises routing each respective scan-chain path to a first input of a respective AND-gate; and routing the respective test-mode control signal to the second input of the respective logic gate comprises routing the respective test-mode control signal to the second input of the respective AND-gate, each respective AND-gate passing scan-chain data on the respective scan-chain path when the respective test-mode control signal is high.

7. The method of scan-chain testing according to claim 5 wherein routing the respective test-mode control signal to the second input of the respective logic gate comprises routing a respective divided clock signal to the second input of the respective logic gate.

8. The method of scan-chain testing according to claim 7 wherein, when the integrated circuit device has a plurality of respective scan-chain testing modes, routing the respective divided clock signal to the second input of the respective logic gate comprises:

dividing the clock signal by a switching factor n using a programmable modulo-n counter; and programming the switching factor n of the modulo-n counter according to a respective scan-chain testing mode to be performed.

9. The method of scan-chain testing according to claim 5 wherein routing the respective test-mode control signal to the second input of the respective logic gate comprises routing the respective test-mode control signal from a low-power testing controller.

10. The method of scan-chain testing according to claim 5 wherein routing the respective test-mode control signal to the second input of the respective logic gate comprises:
grouping respective pluralities of the scan-chain paths, designated as having high power consumption or data congestion, according to degree of power consumption or data congestion; and
routing, to all scan-chain paths in each respective plurality of scan-chain paths, a respective common test-mode control signal to reduce the rate of scan-chain data propagation through all scan-chain paths in the respective plurality of scan-chain paths by a common desired amount.

11. The method of scan-chain testing according to claim 10 further comprising, after propagating the respective scan-chain data patterns through each of the respective scan-chain paths, compressing the propagated scan-chain data patterns.

12. The method of scan-chain testing according to claim 2 further comprising:
receiving compressed scan-chain data; and
decompressing the received compressed scan-chain data to extract each respective scan-chain data pattern.

13. An integrated circuit device, including:
a plurality of input/output terminals; and
scan-chain testing circuitry, comprising:
a plurality of respective scan-chain paths configured to receive scan-chain data patterns from first ones of the plurality of input/output terminals, and to propagate the respective scan-chain data patterns to second ones of the plurality of input/output terminals, at least some of the respective scan-chain paths being designated as having resource constraints; and
scan-chain path gating circuitry configured to gate each respective scan-chain path that is designated as having resource constraints, to reduce a rate of scan-chain data propagation through the respective scan-chain path, without gating any scan-chain path not designated as having resource constraints.

14. The integrated circuit device of claim 13 wherein:
the respective scan-chain paths designated as having resource constraints are designated as having high power consumption or data congestion; and
the scan-chain path gating circuitry is configured to gate each respective scan-chain path that is designated as having high power consumption or data congestion.

15. The integrated circuit device of claim 14 wherein the scan-chain path gating circuitry is configured to individually gate each respective scan-chain path, designated as having high power consumption or data congestion, to reduce the rate of scan-chain data propagation through the respective scan-chain path by an individual desired amount.

16. The integrated circuit device of claim 14 wherein the scan-chain path gating circuitry is configured to:
group respective pluralities of the scan-chain paths, designated as having high power consumption or data congestion, according to degree of power consumption or data congestion; and
gate all scan-chain paths in each respective plurality of scan-chain paths to reduce the rate of scan-chain data propagation through all scan-chain paths in the respective plurality of scan-chain paths by a common desired amount.

17. The integrated circuit device of claim 14 wherein the scan-chain path gating circuitry comprises a respective logic gate in each respective scan-chain path, the scan-chain path gating circuitry being configured to:
route each respective scan-chain path to a first input of a respective logic gate; and
route a respective test-mode control signal to a second input of the respective logic gate.

18. The integrated circuit device of claim 17 wherein:
the respective logic gate is a respective AND-gate; and
the scan-chain path gating circuitry being configured to:
route each respective scan-chain path to a first input of the respective AND-gate; and
route the respective test-mode control signal to the second input of the respective AND-gate; wherein:
each respective AND-gate passes scan-chain data on the respective scan-chain path when the respective test-mode control signal is high.

19. The integrated circuit device of claim 17 wherein the scan-chain path gating circuitry is configured to:
generate a respective divided clock signal as the respective test-mode control signal, and
route the respective divided clock signal to the second input of the respective logic gate.

20. The integrated circuit device of claim 19 wherein, when the integrated circuit device has a plurality of respective scan-chain testing modes:
the scan-chain path gating circuitry comprises a modulo-n counter configured to divide the clock signal by a switching factor n to generate each respective divided clock signal; and
the switching factor n of the modulo-n counter is programmable according to a respective scan-chain testing mode to be performed.

21. The integrated circuit device of claim 17 wherein the scan-chain path gating circuitry comprises a low-power testing controller configured to generate the respective test-mode control signal.

22. The integrated circuit device of claim 17 wherein the scan-chain path gating circuitry is configured to:
group respective pluralities of the scan-chain paths, designated as having high power consumption or data congestion, according to degree of power consumption or data congestion; and
route, to all scan-chain paths in each respective plurality of scan-chain paths, a respective common test-mode control signal to reduce the rate of scan-chain data propagation through all scan-chain paths in the respective plurality of scan-chain paths by a common desired amount.

23. The integrated circuit device of claim 22 further comprising compressor circuitry configured to:
compress the respective scan-chain data patterns after propagation through each of the respective scan-chain paths; and
output the compressed propagated scan-chain data patterns to second ones of the input/output terminals.

24. The integrated circuit device of claim 14 further comprising decompressor circuitry configured to:
receive compressed scan-chain data from first ones of the input/output terminals; and
decompress the received compressed scan-chain data to extract each respective scan-chain data pattern.

* * * * *